United States Patent [19]

Iniewski et al.

[11] Patent Number: 5,734,541
[45] Date of Patent: Mar. 31, 1998

[54] LOW VOLTAGE SILICON CONTROLLED RECTIFIER STRUCTURE FOR ESD INPUT PAD PROTECTION IN CMOS IC'S

[75] Inventors: Kris Iniewski; Brian D. Gerson, both of Coquitlam; Colin Harris, New Westminster; David LeBlanc, Port Moody, all of Canada

[73] Assignee: PMC-Sierra, Inc., Burnaby, Canada

[21] Appl. No.: 650,836

[22] Filed: May 20, 1996

[51] Int. Cl.⁶ ........................... H02H 3/22
[52] U.S. Cl. ............... 361/111; 361/56; 361/118
[58] Field of Search .................. 361/56, 58, 91, 361/111, 118, 127, 119

[56] References Cited

U.S. PATENT DOCUMENTS 5,400,202  3/1995  Metz ............................ 361/56

*Primary Examiner*—Jeffrey A. Gaffin
*Assistant Examiner*—Stephen Jackson
*Attorney, Agent, or Firm*—E. E. Pascal; R. A. Wilkes

[57] ABSTRACT

An electrostatic discharge (ESD) protection structure for protection of a circuit to which an operation voltage is to be applied, comprising a silicon controlled rectifier (SCR) connected between ground and a pad of the circuit to be protected, the SCR including a resistor apparatus connected to the pad for controlling the breakdown voltage of the SCR, and apparatus for controlling the resistor apparatus to a high resistance value in the absence of the application of the operation voltage whereby the SCR is controlled to break down at a low ESD voltage which is lower than a circuit damaging voltage, and to be of low resistance value upon the application of the operation voltage whereby the SCR is controlled to break down at an ESD voltage which is higher than the low ESD voltage.

3 Claims, 3 Drawing Sheets

LOW VOLTAGE SILICON CONTROLLED RECTIFIER STRUCTURE FOR ESD INPUT PAD PROTECTION IN CMOS IC'S

FIELD OF THE INVENTION

This invention relates to the field of integrated circuits, and in particular to an electrostatic discharge (ESD) protection circuit therefor.

BACKGROUND TO THE INVENTION

ESD typically arises during handling, such as during packaging, shipment, installation, etc. Therefore integrated circuits require on-chip protection against ESD, which could destroy them. ESD protection generally involves providing an efficient discharge path which routes electrostatic charge around a circuit to be protected, without damaging the circuit. A discharge route is typically connected between ground and a conductive pad such as an input pad, output pad, input/output pad, and/or power pad of the integrated circuit.

Protection of input pads becomes very difficult in deep submicron complementary metal oxide silicon (CMOS) integrated circuit technologies. These technologies use very thin oxides, with thicknesses below 10 nm, which can break down when ESD voltages appear across them even below 10 volts. In order to serve as a useful protection device against an ESD event, the protection device must break down at a voltage which is lower than the oxide breakdown voltage.

A well known protection circuit uses a silicon controlled rectifier (SCR) connected between a pad of an integrated circuit and ground. FIG. 1 illustrates a circuit and FIG. 2 illustrates a crossection of such an SCR. With reference to FIG. 1, the SCR is formed of a PNP bipolar transistor 1, an NPN bipolar transistor 3, and two resistors 5 and 7. The base of transistor 1 is connected to one end of resistor 5 and to the collector of transistor 3, and the emitter of transistor 1 is connected to the other end of resistor 5 and to the pad of the integrated circuit to be protected. The collector of transistor 1 is connected to the base of transistor 3 and to one end of resistor 7. The emitter of transistor 3 is connected to the other end of resistor 7 and to ground.

A crossection of an equivalent integrated circuit to the above is shown in FIG. 2. Transistor 1 is formed by the adjacent n+ and p+ regions 9 and 11 diffused into n-well 13, which is diffused into a p-substrate 15. Transistor 3 is formed by the n+ and p+ regions 17 and 19 diffused into the p-substrate 15. Regions 9 and 11 are diffused into n-well 13 at a distance from the edge of n-well that fronts n+ and p+ regions 17 and 19, so that resistor 5 is formed by the additional semiconductor material between the edge of the p+ region 11 and the edge of the n-well that is adjacent the n+ region 17. The pad is connected to the n+ and p+ regions 9 and 11, and ground is connected to the n+ and p+ regions 17 and 19.

In operation, the breakdown process occurs at the corner of the n-well and the p-substrate. Unfortunately, the voltage at which breakdown occurs is, for example, 40 to 60 volts. This circuit would not work to protect a submicron integrated circuit, since at a significantly lower voltage than the breakdown voltage of the SCR, the thin oxide of the submicron circuit would have already broken down and the ESD would have destroyed the submicron circuit.

FIG. 3 illustrates the crossection of an improvement to the circuit of FIG. 1. In this case, an n+ diffused region 21 is located at the edge of the n-well 13, which overlaps the n-well 13 and the p-substrate 15. The diffused region 21 is placed a predetermined distance from n+ region 17. An insulated gate 23 is located over parts of n+ regions 17 and 21 and channel region between them, forming a MOSFET. The gate 23 is connected to ground.

In this case, the gate causes the MOSFET conduct and the SCR to operate (i.e. breakdown) at a voltage which is much lower than the breakdown voltage of the version of FIG. 2, e.g. 8–12 volts. This makes application in a submicron process feasible (see U.S. Pat. No. 4,939,616, invented by R. Rountree).

FIG. 4 illustrates a crossection of a circuit which can lower the breakdown voltage of the SCR even further, e.g. to 2–8 volts. FIG. 4 is similar to FIG. 3, except that instead of the gate 23 being connected directly to ground, it is connected to ground through a gate coupling circuit 25. The gate coupling circuit can be a resistor, an inverter, or a more complex triggering circuit.

A problem with this low voltage SCR is that once turned on, it can stay in the on state even when the triggering signal vanishes, and it can turn on during normal circuit operation.

Indeed, a problem with all of the SCR based circuits is that they protect from ESD which exceeds a particular voltage, at all times. Yet the problem of ESD typically only arises during ESD testing, packaging, transportation and installation of the integrated circuit. Once installed, in the absence of further handling, the problem of ESD seldom occurs. Thus an ESD protection circuit for a submicron circuit that have very thin oxides, such as an ESD protection circuit that will protect against ESD of 2–8 volts, will breakdown and stop operation of the circuit it is intended to protect, with the application of operating voltage to the circuit to be protected of e.g. 3 volts or 5 volts.

SUMMARY OF THE INVENTION

The present invention is an ESD protection circuit which will protect a submicron integrated circuit against ESD, and yet allows operation of the integrated circuit without breaking down in the presence of normal operating voltage of the integrated circuit. It does this by varying the breakdown voltage of the SCR to different values in the absence and in the presence of operating voltage of the integrated circuit to be protected.

A preferred embodiment of the present invention is manufacturable using standard polysilicon gate CMOS processes. It has a low turn-on (breakdown) threshold when the device to be protected is not powered up, and has a higher turn-on threshold when the device to be protected is powered up. It does not interfere with normal circuit operation, since it does not breakdown when normal operating voltage is applied to the circuit to be protected.

In accordance with an embodiment of the present invention, an electrostatic discharge (ESD) protection structure for protection of a circuit to which an operation voltage is to be applied is comprised of a silicon controlled rectifier (SCR) connected between ground and a pad of the circuit to be protected, the SCR including a resistive structure connected to the pad for controlling the breakdown voltage of the SCR, and apparatus for controlling said resistor structure to a high resistance value in the absence of the application of the operation voltage whereby the SCR is controlled to break down at a low ESD voltage which is lower than a circuit damaging voltage, and to be of low resistance value upon the application of the operation voltage whereby the SCR is controlled to break down at an ESD voltage which is higher than the low ESD voltage.

In accordance with another embodiment, an ESD protection integrated circuit is comprised of an n-well in a p-substrate, two pair of adjoining p+n+ diffused regions, one pair of the adjoining regions being diffused from a surface of the integrated circuit into an edge of the n-well whereby its n+ region intersects a boundary between the n-well and the p-substrate and its n+ region is contained in the n-well, another pair of the adjoining regions being diffused into the p-substrate whereby its n+ region is adjacent but is spaced a predetermined distance from the n+ region of the one pair of the adjoining regions, a gate overlying and insulated from the surface over and between the n+ regions, a further n+ region diffused into the n-well, a further p+ region diffused into the n-well, apparatus for connecting a pad of a circuit to be protected to both the further n+ region and to the p+ region of the one pair, apparatus for connecting the gate to ground via a gate coupling circuit, and apparatus for connecting a breakdown control voltage to the further p+ region.

In accordance with another embodiment, an electrostatic discharge (ESD) protection structure for protection of a circuit to which an operation voltage is to be applied is comprised of breakdown apparatus connected between a current sink and a pad of the circuit to be protected, and apparatus for modulating a breakdown threshold voltage of the breakdown apparatus for enabling the breakdown apparatus to break down and conduct current between the pad and current sink at a low ESD voltage which is below a damaging voltage of the circuit in the absence of an application of the operation voltage, and for enabling the breakdown apparatus to break down and conduct current between the pad and current sink at an ESD voltage which is at a higher ESD voltage than the low ESD voltage when the operation voltage is applied.

BRIEF INTRODUCTION TO THE DRAWINGS

A better understanding of the invention will be obtained by considering the detailed description below, with reference to the following drawings, in which:

FIG. 1 is a schematic of an ESD protection circuit in accordance with the prior art, FIG. 2 is a crossection of an integrated circuit for implementing the circuit of FIG. 1, FIG. 3 is a crossection of an integrated circuit that is an improvement to the circuit of FIGS. 1 and 2, FIG. 4 is a crossection of an integrated circuit that is an improvement to the circuit of FIG. 3, FIG. 5 is a schematic of a circuit in accordance with an embodiment of the present invention, and FIG. 6 is a crossection of an embodiment of an integrated circuit for implementing the circuit of FIG. 5.

DETAILED DESCRIPTION OF AN EMBODIMENT OF THE INVENTION

Figure 1:
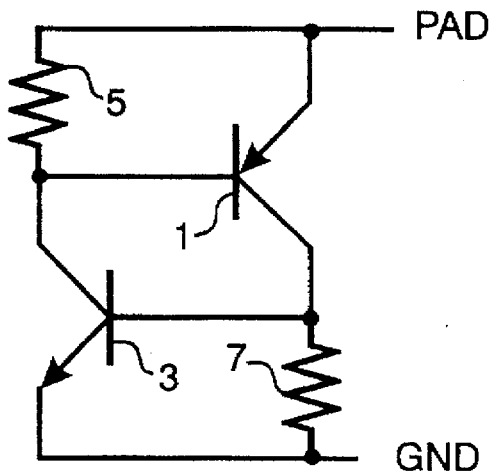
Figure 2:
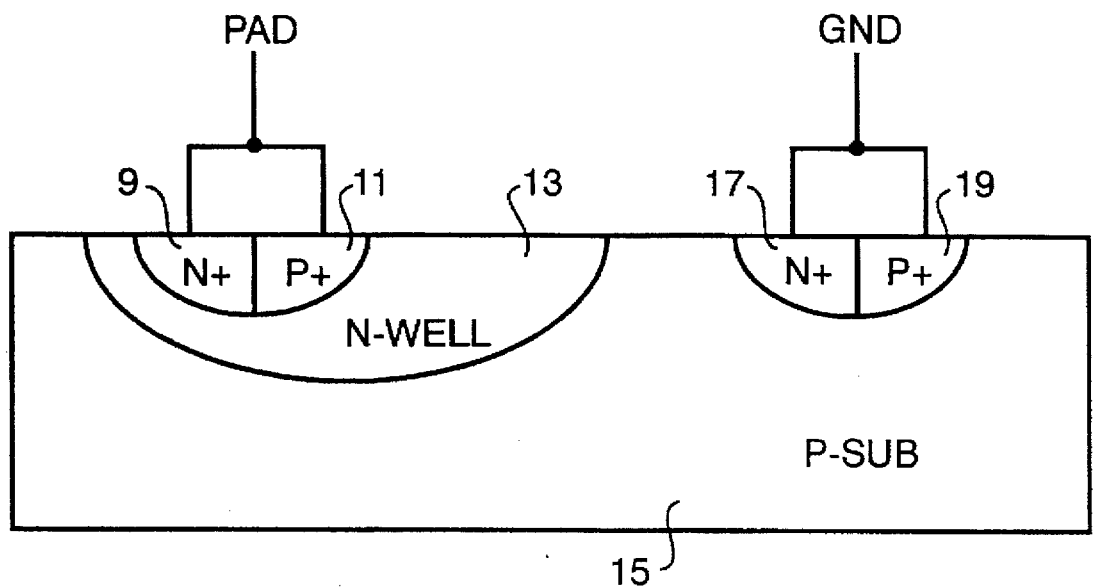
Figure 3:
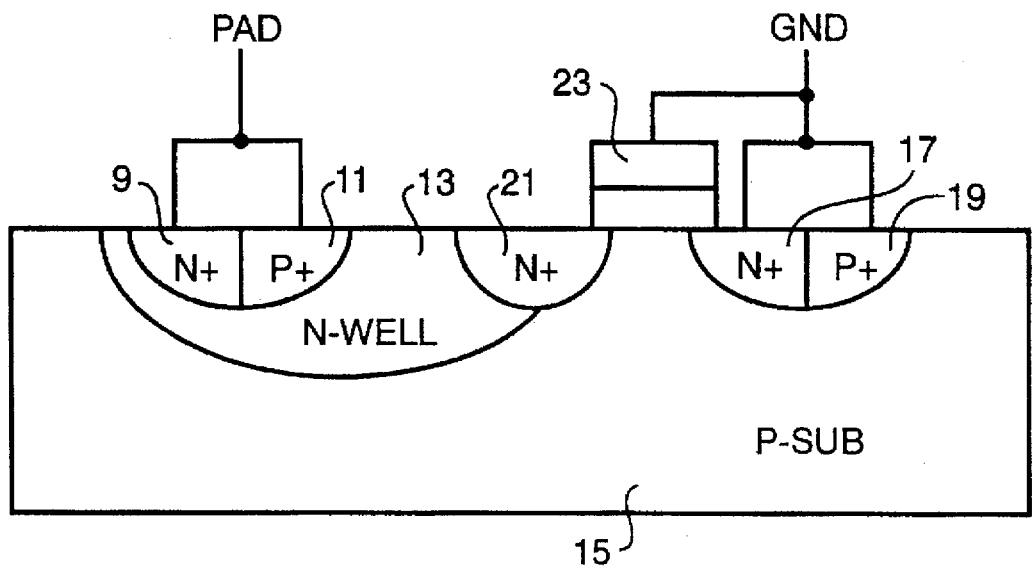
Figure 5:
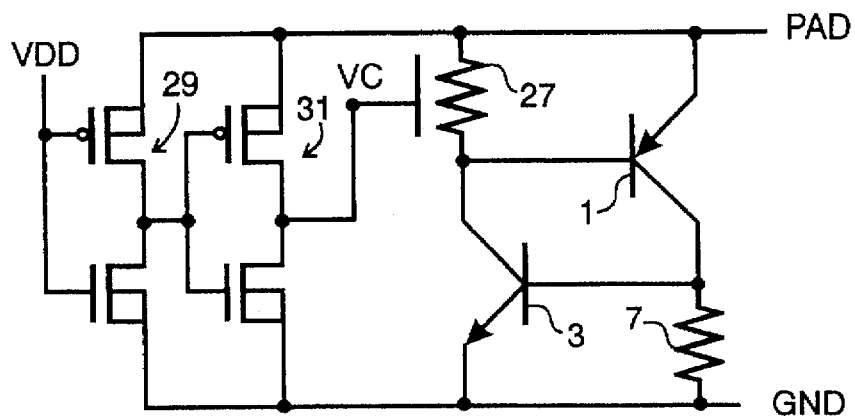

Turning now to FIG. 5, a schematic of an embodiment of the invention is illustrated. The schematic of the SCR is as described with reference to FIG. 1, except that instead of resistor 5, a device 27 is used which can provide variable breakdown threshold to the SCR. The device 27 thus provides a means for modulating the breakdown voltage of the SCR. The modulating (control) voltage is applied to node Vc.

The device 27 can be a variable resistance device or structure, such as a junction field effect transistor (JFET).

While the control voltage to be applied to node Vc can be derived from any suitable source, it is preferred that it should be derived directly from the operation voltage Vdd used to power the circuit to be protected. One way of deriving this voltage is to apply it to the gates of the complementary FETs of CMOS inverter 29. Another similar CMOS inverter 31 is connected in series with inverter 29. The sources of the similar polarity FETs of the inverters are connected together and to the pad and to ground, as shown. The n-wells of both PMOS transistors are connected to the pad, and not to Vdd to ensure that their drain/well diodes are always biased in the reverse direction.

Figure 4:
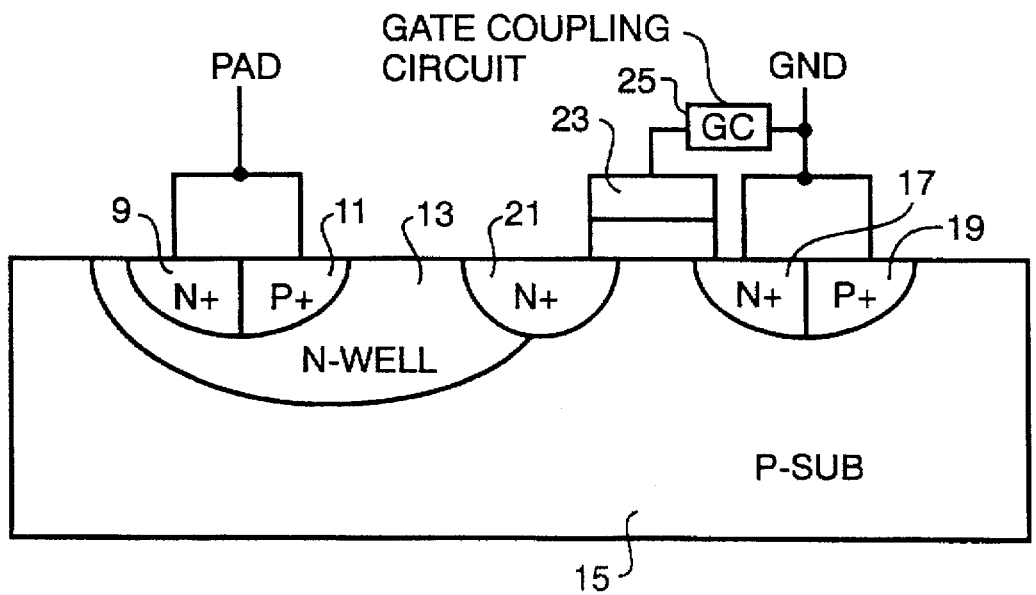
Figure 6:
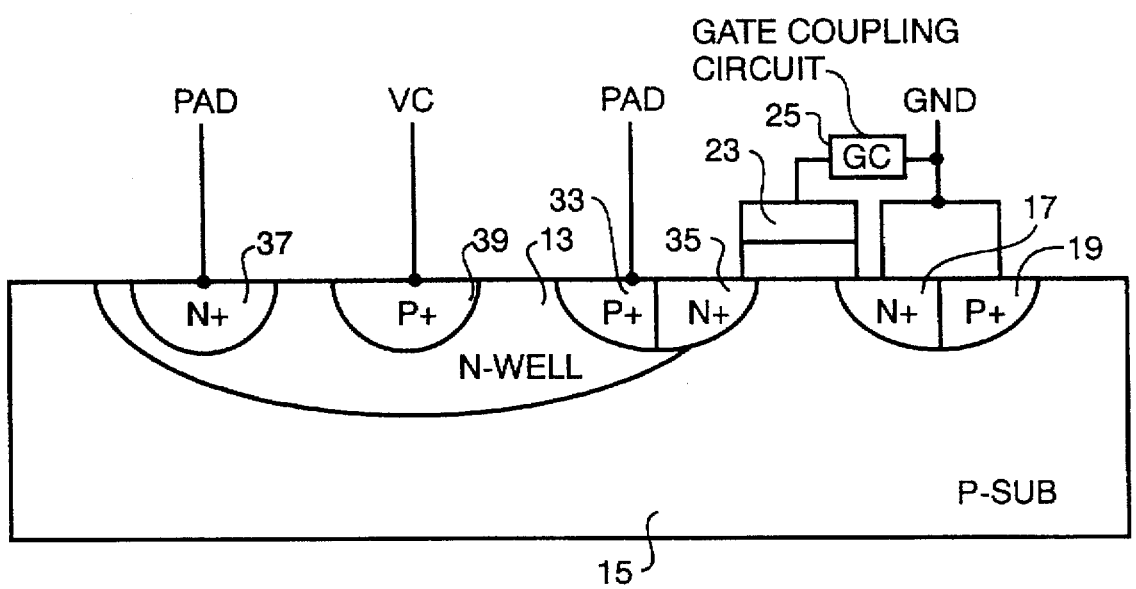

With reference to FIG. 6, the diffused regions 17 and 19 are similar to the structure of FIG. 4. However adjoining p+ and n+ diffused regions are located adjacent the edge of the n-well 13, so that the n+ diffused region overlaps the n-well 13 and the p-substrate 15 similarly to FIG. 4. However the p+ region is contained within the n-well. A gate 23 overlies part of the n+ region 35, part of the n+ region 17, and the channel region between them, in a manner similar to FIG. 4.

However another n+ diffused region 37 is contained in the n-well 13. Both p+ region 33 and n+ region 37 are connected to a pad of a circuit to be protected. Another p+ diffused region 39 is contained within the n-well 13.

The n-well resistor previously described, is in the present case connected to the pad through the n+ diffused region 37, and by n+ region 35, which is a source of an NMOS transistor. Thus this resistor can alternatively be considered as the aforenoted JFET. The gate of this JFET is formed by the p+ diffused region 39, to which control voltage at node Vc is to be applied (e.g. from the output of inverter 31, not shown in FIG. 6).

It should be noted that since the inverters 29 and 31 are not in the electrostatic discharge path, they can be of minimal geometry.

In operation, negative pad voltage ESD is discharged through the n-well/p-substrate diode. The mechanism is similar to most ESD protection structures currently used industrially.

With respect to positive pad voltage, when the circuit to be protected is not powered up, e.g. during handling, the gate of the first inverter 29 is at ground potential (zero). As a result of the double inversion in inverters 29 and 31, the voltage at the node Vc is also zero. Since the n-well 13 under the p+ island 39 is at the pad potential, significant reverse bias exists across the pn 39-13 junction. As the pad voltage increases in a positive direction, this reverse bias increases, which increases the corresponding depletion layer width. As the depletion layer width increase, an effective resistor depth (in a direction perpendicular to the surface of the integrated circuit) decreases. In a similar manner, the depletion layer of the pn 13-15 junction also increase, decreasing further the effective resistor width.

As a result of both mechanisms, resistance of the path of the n-well that forms the resistive structure of device 27 increases, e.g. to hundreds of kilohms. This decreases the voltage required to turn on the SCR, as compared to the case of no modulation of the resistance of device 27. Once the SCR has been turned on, it works in the usual manner, providing a low resistance path between the pad and ground (or to another current sink if used instead of ground).

When the device to be protected is powered up, Vdd and the pad are at the device operation voltage. The voltage at node Vc is substantially equal to the operation voltage Vdd. As a result the voltage across the pn junction 39-13 is close to zero. The resistance of the device 27 has its normal relatively low value (of the order of kilohms), and the turn-on voltage of the SCR is significantly higher than in the previously described case.

Thus, when the device to be protected is not powered up, the present invention provides effective ESD protection. When the device to be protected is powered up, during normal circuit operation, it can be turned on, but at significantly higher voltage.

The amount of SCR threshold voltage reduction is dependent on the process. The parameters that will determine this are n-well sheet resistance, the n-well junction depth, the p+ diffusion and junction depth and the p-substrate resistivity. For one standard 0.5 micron CMOS process, not optimized for ESD robustness other than the use of the present invention, it was determined that the resistance of device 27 increased by a factor of 11. This substantial improvement can be made even better if a particular process used were optimized.

A person understanding this invention may now conceive of alternative structures and embodiments or variations of the above. All those which fall within the scope of the claims appended hereto are considered to be part of the present invention.

We claim:

1. An electrostatic discharge (ESD) protection structure for protection of a circuit to which an operation voltage is to be applied, comprising a silicon controlled rectifier (SCR) connected between ground and a pad of said circuit to be protected, the SCR including a resistor means connected to the pad for controlling the breakdown voltage of the SCR, the SCR being comprised of a PNP bipolar transistor, an NPN bipolar transistor, said resistor means and a second resistor, a base of the PNP transistor being connected to a collector of the NPN transistor and to one end of said resistor means, an emitter of the PNP transistor being connected to another end of said resistor means and to the pad, a collector of the PNP transistor being connected to a base of the NPN transistor and to one end of the second resistor, and an emitter of the NPN transistor being connected to another end of the second resistor and to ground, and means for controlling said resistor means to a high resistance value in the absence of the application of said operation voltage whereby the SCR is controlled to break down at a low positive ESD voltage which is lower than a circuit damaging voltage, and to be of low resistance value upon the application of said operation voltage whereby the SCR is controlled to break down at an ESD voltage which is higher than said low ESD voltage, said resistor means comprises a junction field effect transistor (JFET), said means for controlling comprising a gate of said JFET and means for applying a controlling voltage to said gate, including means for deriving said controlling voltage from said operation voltage.

2. An ESD protection structure as defined in claim 1 in which said means for deriving said controlling voltage is comprised of a pair of CMOS inverters connected in series and having respective opposite sources of opposite channel type FETs of which the inverters are formed connected to the pad and to ground, an output of a second one of the inverters being connected to the gate of said JFET, and an input of a first one of the inverters being connected to a voltage source for carrying said operation voltage.

3. An ESD protection integrated circuit comprising an n-well in a p-substrate, two pair of adjoining p+n+ diffused regions, one pair of said adjoining regions being diffused from a surface of said integrated circuit into an edge of said n-well whereby its n+ region intersects a boundary between the n-well and the p-substrate and its p+ region is contained in the n-well, another pair of said adjoining regions being diffused into the p-substrate whereby its n+ region is adjacent but is spaced a predetermined distance from the n+ region of said one pair of said adjoining regions, a gate overlying and insulated from said surface over and between said n+ regions, a further n+ region diffused into the n-well, a further p+ region diffused into the n-well, means for connecting a pad of a circuit to be protected to both said further n+ region and to the p+ region of said one pair, means for connecting the gate to ground via a gate coupling circuit, and means for connecting a breakdown control voltage to said further p+ region.

* * * * *